(12) United States Patent
Liang et al.

(10) Patent No.: US 12,512,439 B2
(45) Date of Patent: Dec. 30, 2025

(54) WAFER BONDING METHOD AND SEMICONDUCTOR STRUCTURE OBTAINED BY THE SAME

(71) Applicant: TAIWAN SEMICONDUCTOR MANUFACTURING COMPANY, LTD., Hsinchu (TW)

(72) Inventors: Zheng-Yong Liang, Hsinchu (TW); Wei-Ting Yeh, Hsinchu (TW); Yu-Yun Peng, Hsinchu (TW); Keng-Chu Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 559 days.

(21) Appl. No.: 17/869,297

(22) Filed: Jul. 20, 2022

(65) Prior Publication Data

US 2024/0030180 A1    Jan. 25, 2024

(51) Int. Cl.
*H01L 21/20* (2006.01)
*H01L 21/18* (2006.01)
(Continued)

(52) U.S. Cl.
CPC ............ *H01L 24/83* (2013.01); *H01L 21/187* (2013.01); *H01L 21/2007* (2013.01); *H01L 24/30* (2013.01); *H01L 24/33* (2013.01); *C23C 16/455* (2013.01); *H01L 21/3065* (2013.01); *H01L 2224/30104* (2013.01); *H01L 2224/30505* (2013.01); *H01L 2224/33505* (2013.01); *H01L 2224/83031* (2013.01); *H01L 2224/83097* (2013.01); *H01L 2224/83193* (2013.01); *H01L 2224/83359* (2013.01); *H01L 2224/83896* (2013.01); *H01L 2224/83948* (2013.01)

(58) Field of Classification Search
CPC ......... H01L 2224/83896; H01L 21/187; H01L 21/2007
See application file for complete search history.

(56) References Cited

U.S. PATENT DOCUMENTS

| | | | | |
|---|---|---|---|---|
| 5,648,175 A | * | 7/1997 | Russell | ............ H01L 21/02271 427/314 |
| 2013/0049210 A1 | * | 2/2013 | Endo | ........................ H01L 24/05 257/773 |
| 2015/0337431 A1 | * | 11/2015 | Biskeborn | ............. A61L 31/088 204/192.3 |

OTHER PUBLICATIONS

J. Vac. Sci. Technol. B 36, 011202 (2018) (Year: 2008).*

(Continued)

*Primary Examiner* — Jarrett J Stark
(74) *Attorney, Agent, or Firm* — Birch, Stewart, Kolasch & Birch, LLP

(57) ABSTRACT

A method for manufacturing a semiconductor structure includes: forming a first bonding layer on a device substrate formed with a semiconductor device so as to cover the semiconductor device, wherein the first bonding layer includes a first metal oxide material in an amorphous state; forming a second bonding layer on a carrier substrate, wherein the second bonding layer includes a second metal oxide material in an amorphous state; conducting a surface modification process on the first bonding layer and the second bonding layer; bonding the device substrate and the carrier substrate to each other through the first and second bonding layers; and annealing the first and second bonding layers so as to convert the first and second metal oxide materials from the amorphous state to a crystalline state.

20 Claims, 5 Drawing Sheets

(51) Int. Cl.
*H01L 23/00* (2006.01)
*C23C 16/455* (2006.01)
*H01L 21/3065* (2006.01)

(56) References Cited

OTHER PUBLICATIONS

Direct wafer bonding of atomic layer deposited TiO2 and Al2O3 thin films. 978-981. 10.1109/TRANSDUCERS.2011.5969474 (Year: 2011).*
Characterization of Al2O3 thin films prepared by thermal ALD, Energy Procedia, 77 (2015), pp. 558-564 (Year: 2015).*
Surface Science, vol. 600, Issue 21, 2006, pp. 4870-4877, ISSN 0039-6028 (Year: 2006).*
J Mater Sci: Mater Med (2011) 22:1813-1824 DOI 10.1007/s10856-011-4356-x (Year: 2011).*

\* cited by examiner

WAFER BONDING METHOD AND SEMICONDUCTOR STRUCTURE OBTAINED BY THE SAME

BACKGROUND

The semiconductor integrated circuit (IC) industry has, over the decades, experienced tremendous advancements and is still undergoing vigorous development. With dramatic advances in technology, the industry pays much attention on the development of small IC devices with high performance and low power consumption. Since substrate is an important component of semiconductor devices, substrate bonding issue, such as heat dissipation issue, needs be solved in order to facilitate manufacturing process of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
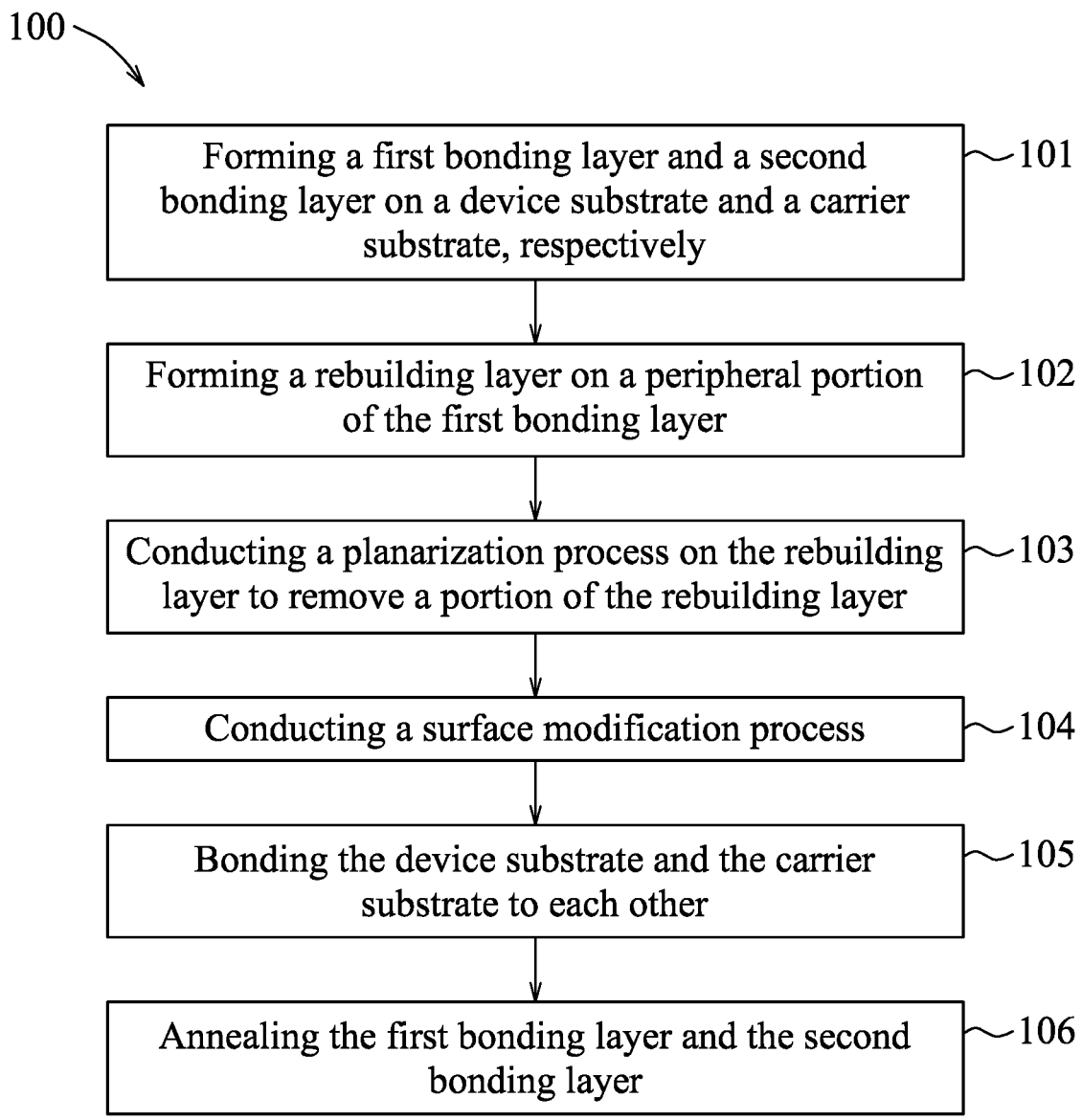
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "above," "upper," "lower,", "horizontal," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a substrate bonding method and a semiconductor structure obtained by the substrate bonding method. In the substrate bonding method (for example, fusion bonding), the semiconductor structure includes two substrates being bonded to each other through a metal oxide bonding layer having a high thermal conductivity. The present disclosure provides an exemplary method to manufacture, for example, but not limited to, a semiconductor structure which includes a device substrate, a semiconductor device formed on the device substrate, and a blank substrate serving as a carrier substrate and bonded to the device substrate through the metal oxide bonding layer, as shown in FIG. 7. The semiconductor structure may be further applied in any appropriate applications, for example, but not limited to, backside illumination complementary metal-oxide-semiconductor image sensor, digital signal processors, memory devices, analog processors, radio frequency (RF) circuits, resistors, inductors, and capacitors. Other suitable applications are within the contemplated scope of the disclosure. FIG. 1 is a flow diagram illustrating the exemplary method for manufacturing the exemplary semiconductor structure as shown in FIG. 7 in accordance with some embodiments. FIGS. 2 to 7 are schematic views of some intermediate stages of the manufacturing method as depicted in FIG. 1 in accordance with some embodiments. Some portions are omitted in FIGS. 2 to 7 for the sake of brevity. Additional steps can be provided before, after or during the method 100, and some of the steps described herein may be replaced by other steps or be eliminated.

Figure 2:
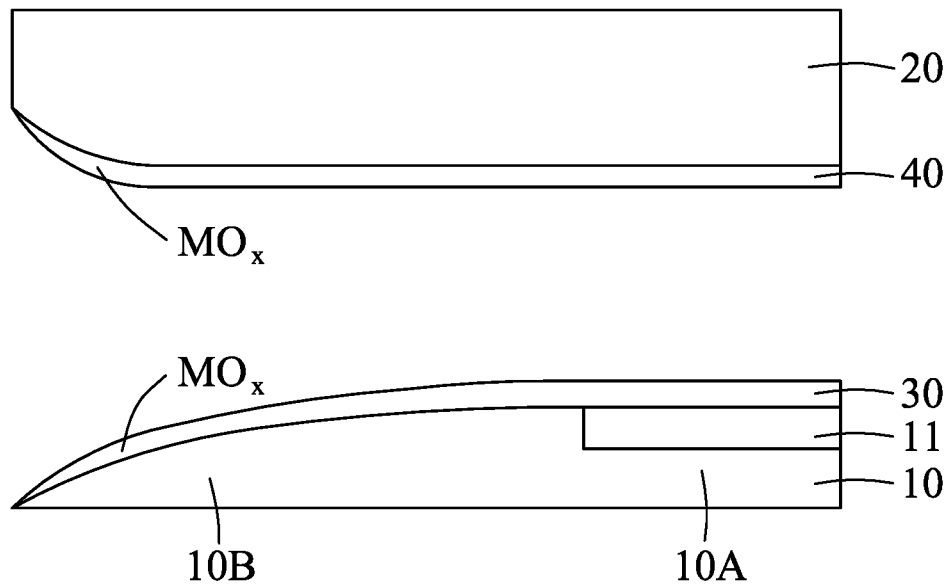
FIGS. 2 to 7 are schematic views showing some intermediate stages of the method depicted in FIG. 1.

Referring to FIG. 1 and the example illustrated in FIG. 2, the method 100 begins at step 101, where a first bonding layer and a second bonding layer are formed on a device substrate and a carrier substrate, respectively. FIG. 2 is a schematic view illustrating formation of a first bonding layer 30 and a second bonding layer 40 on a device substrate 10 and a carrier substrate 20, respectively. The device substrate 10 may be, for example, but not limited to, a device wafer, and is formed with a semiconductor device 11 thereon. In some embodiments, the semiconductor device 11 may be embedded into the device substrate 10, as shown in FIG. 2. In some embodiments, the semiconductor device 11 may be formed on the device substrate 10. The first bonding layer 30 is formed on the device substrate 10 to cover the semiconductor device 11.

The device substrate 10 has a main region 10A and a peripheral region 10B surrounding the main region 10A. The device substrate 10 may have a predetermined thickness and a predetermined radius such that the device substrate 10 are suitable to be processed in subsequent steps. In some exemplary embodiments, the device substrate 10 may be a "12 inch" substrate, i.e., having a radius of approximately 150 mm, with a thickness of approximately 765 µm to 775 µm. Other size and/or thickness suitable for the device substrate 10 are within the contemplated scope of the present disclosure.

In some embodiments, the device substrate 10 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor substrate. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorus (P), or arsenic (As). Other suitable materials are within the contemplated scope of the present disclosure.

The semiconductor device 11 is formed on the main region 10A of the device substrate 10 so as to leave the peripheral region 10B unoccupied. The semiconductor device 11 may include a front-end-of-line (FEOL) portion formed on the device substrate 10 and including, for example, but not limited to, a logic circuitry with transistors, a memory circuitry having memory elements, passive elements, and/or other suitable elements; a middle-end-of-line (MEOL) portion formed on the FEOL portion and including, for example, but not limited to, metal contacts to be electrically connected to electrodes of the elements in the FEOL portion (for example, but not limited to, gate, source, and drain electrodes of the transistors), interlayer dielectric (ILD) layers among the metal contacts, and/or other suitable elements; and a back-end-of-line (BEOL) portion formed on the MEOL portion and including, for example, but not limited to, metallization layers (metal lines or vias) formed to electrically connect the metal contacts to an external circuitry out of the semiconductor device 11, and additional ILD layers among the metallization layers. The semiconductor device 11 may be formed using any appropriate materials and/or methods. In some embodiments, the BEOL portion may further include a protective dielectric layer which is formed opposite to the MEOL portion, and which may serve as an etch stop layer so as to protect other elements of the BEOL portion formed therebeneath from being damaged due to steps performed subsequently. The protective dielectric layer may include a dielectric nitride such as silicon nitride, silicon carbon nitride, or other suitable materials. Other suitable materials and methods for forming the semiconductor device 11 are within the contemplated scope of the present disclosure.

The semiconductor device 11 may have a predetermined size and thickness according to layout of the design. In some exemplary embodiments, when the device substrate 10 is a "12 inch" wafer having a radius of approximately 150 mm, the main region 10A may have a radius of approximately 148 mm, and thus the peripheral region is located to be spaced apart from a center of the device substrate 10 by a distance that ranges from approximately 148 mm to 150 mm. It should be noted that other suitable sizes of the main region 10A and the peripheral region 10B are within the contemplated scope of the present disclosure. The peripheral region 10B of the device substrate 10 has a thickness which decreases gradually along a horizontal direction away from the main region 10A of the device substrate 10 due to a plurality of planarization processes (for example, but not limited to, chemical mechanic polishing (CMP) processes) conducted in the manufacturing process of the semiconductor device 11.

The carrier substrate 20 may be, for example, but not limited to, a carrier wafer, and may include any suitable material which may be the same as or similar to that of the device substrate 10, and will not be discussed in detail for the sake of brevity. Other materials suitable for the carrier substrate 20 are within the contemplated scope of the present disclosure. In some embodiments, the carrier substrate 20 is a blank substrate. The carrier substrate 20 may have a predetermined thickness according to practical needs.

The first bonding layer 30 is formed on the device substrate 10 by a suitable deposition process as is known to those skilled in the art of semiconductor fabrication, for example, but no limited to, physical vapor deposition (PVD), plasma-enhanced chemical vapor deposition (PECVD), plasma-enhanced atomic layer deposition (PEALD), thermal ALD, or the like, to cover the semiconductor device 11. Other suitable techniques are within the contemplated scope of the present disclosure. In some embodiments, the deposition process is conducted at a temperature ranging from about room temperature to about 300° C. so as to form the first bonding layer 30 in an amorphous state on the device substrate 10 to cover the semiconductor device 11. If the deposition process is conducted at a temperature higher than 300° C., the first bonding layer 30 may be undesirably converted to a crystalline state at this stage. In some embodiments, the deposition process is conducted at a temperature of at least about room temperature and lower than about 260° C. In some embodiments, the deposition process is conducted at a temperature ranging from about room temperature to about 200° C. In some embodiments, the first bonding layer 30 may include a first metal oxide material having a general formula represented by $MO_x$, wherein M is selected from Al, Ti, Ni, Zn, or combinations thereof, and x is a number satisfying the valence of M. In some embodiments, the first metal oxide material may include, for example, but not limited to, aluminum oxide, titanium oxide, nickel oxide, zinc oxide, or combinations thereof. Other suitable metal oxide materials are within the contemplated scope of the present disclosure. In some embodiments, the first bonding layer 30 may have a thickness ranging from about 10 nm to about 200 nm.

The second bonding layer 40 may be formed on the carrier substrate 20 in a manner similar to that of formation of the first bonding layer 30 on the device substrate 10, and the details thereof are omitted for the sake of brevity. In some embodiments, the second bonding layer 40 may include a second metal oxide material having a general formula represented by $MO_x$, wherein M is selected from Al, Ti, Ni, Zn, or combinations thereof, and x is a number satisfying the valence of M. In some embodiments, the second metal oxide material may include, for example, but not limited to, aluminum oxide, titanium oxide, nickel oxide, zinc oxide, or combinations thereof. Other suitable metal oxide materials are within the contemplated scope of the present disclosure. In some embodiments, the second bonding layer 40 may have a thickness ranging from about 10 nm to about 200 nm.

Figure 3:
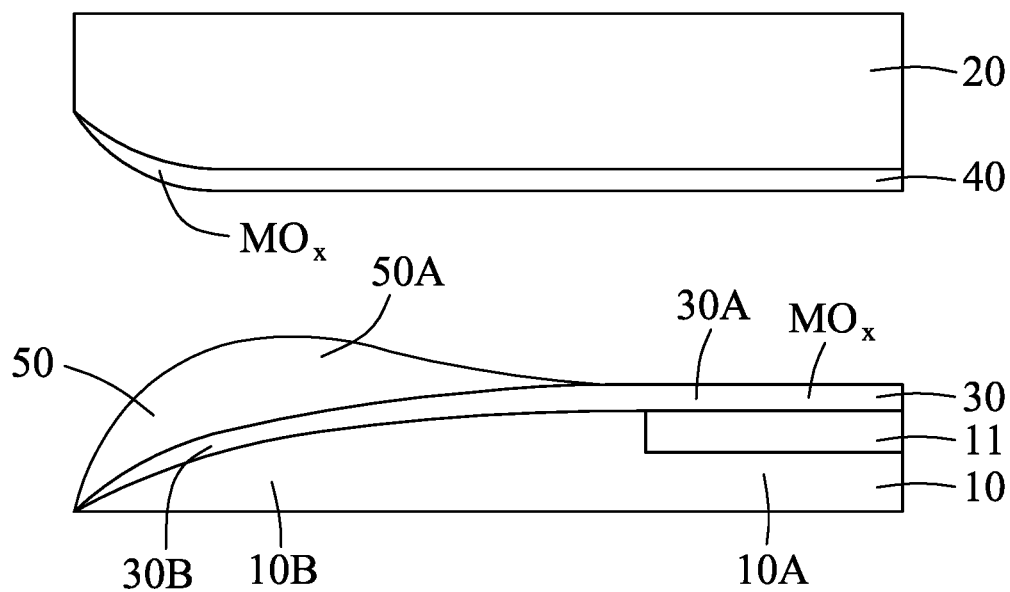

Referring to FIG. 1 and the example illustrated in FIG. 3, the method 100 proceeds to step 102, where a rebuilding layer is formed on a peripheral portion of the first bonding layer. FIG. 3 is a schematic view illustrating formation of a rebuilding layer on a peripheral portion 30B of the first bonding layer 30 disposed on the peripheral region 10B of the device substrate 10. The peripheral portion 30B of the first bonding layer 30 surrounds a main portion 30A of the first bonding layer 30 disposed on the main region 10A of the device substrate 10. On the peripheral region 10B of the device substrate 10, relative to the device substrate 10, an upper surface of a portion 50A of the rebuilding layer 50 opposite to the device substrate 10 may be at a level not lower than that of an upper surface of the main portion 30A of the first bonding layer 30. In some embodiments, the rebuilding layer 50 has a thickness ranging from about 1 μm to about 4.5 μm.

In some embodiments, step 102 may include sub-steps of (i) disposing a blocking element (not shown) above the main portion 30A of the first bonding layer 30 opposite to the device substrate 10 in a manner that the blocking element is spaced apart from the main portion 30A of the first bonding layer 30, and (ii) performing a deposition process so as to form the rebuilding layer 50 on the peripheral portion 30B of the first bonding layer 30.

The configuration of the blocking element permits, in sub-step (ii), the rebuilding layer 50 to be selectively formed on the peripheral portion 30B of the first bonding layer rather than being formed over the first bonding layer 30 entirely. That is, when a precursor for forming the rebuilding layer 50 is applied over the first bonding layer 30, a portion of the precursor is blocked by the blocking element and is directed to the peripheral portion 30B of the first bonding layer 30, instead of reaching the main portion of the first bonding layer 30. It is noted that the rebuilding layer 50 may have a non-uniform thickness, e.g., in some embodiments, the rebuilding layer 50 is formed with a thickness that gradually decreases toward the main portion 30A of the first bonding layer 30. By adjusting the size and/or configuration of the blocking element, it is possible to regulate size, shape and/or thickness of the rebuilding layer 50 thus formed.

In some embodiments, one blocking element is employed to assist formation of the rebuilding layer 50. Alternatively, in some other embodiments, two blocking elements may be employed by further disposing another blocking element above the device substrate 10 opposite to the first bonding layer 30, such that the device substrate 10 and the first bonding layer 30 are interposed between the two blocking elements. With such configuration, the rebuilding layer 50 is mainly formed on the peripheral portion 30B of the first bonding layer 30, leaving the opposite side of the device substrate 10 vacant (i.e., the peripheral region 10B of the device substrate 10 is not wrapped). In some embodiments, the blocking elements may be placed in a symmetrical manner. In some other embodiments, the blocking elements may be placed in a non-symmetrical manner. The disposal of the two blocking elements may be determined according to a desired shape, size, and/or thickness of the rebuilding layer 50.

In some embodiments, the rebuilding layer 50 may include an oxide dielectric material, an oxynitride dielectric material, or a combination thereof. In some embodiments, the rebuilding layer 50 includes, for example, but not limited to, silicon oxide ($SiO_x$), silicon oxynitride ($SiO_xN_y$), or a combinations thereof. Other suitable dielectric materials for forming the rebuilding layer 50 are within the contemplated scope of the present disclosure.

The rebuilding layer 50 may be formed by a suitable deposition process as is known to those skilled in the art of semiconductor fabrication, for example, but no limited to, chemical vapor deposition (CVD), PECVD, high-density plasma CVD (HDPCVD), PVD, or ALD. Other suitable deposition processes for forming the rebuilding layer 50 are within the contemplated scope of the present disclosure. In some embodiments, the PECVD process, which is known for having a high deposition rate, is adopted so that the rebuilding layer 50 can be obtained within a short period of time. A precursor for forming the rebuilding layer 50 that includes silicon oxide using the PECVD process may include, for example, but not limited to, silane ($SiH_4$) or tetraethoxysilane (TEOS), in addition to oxygen.

Figure 4:
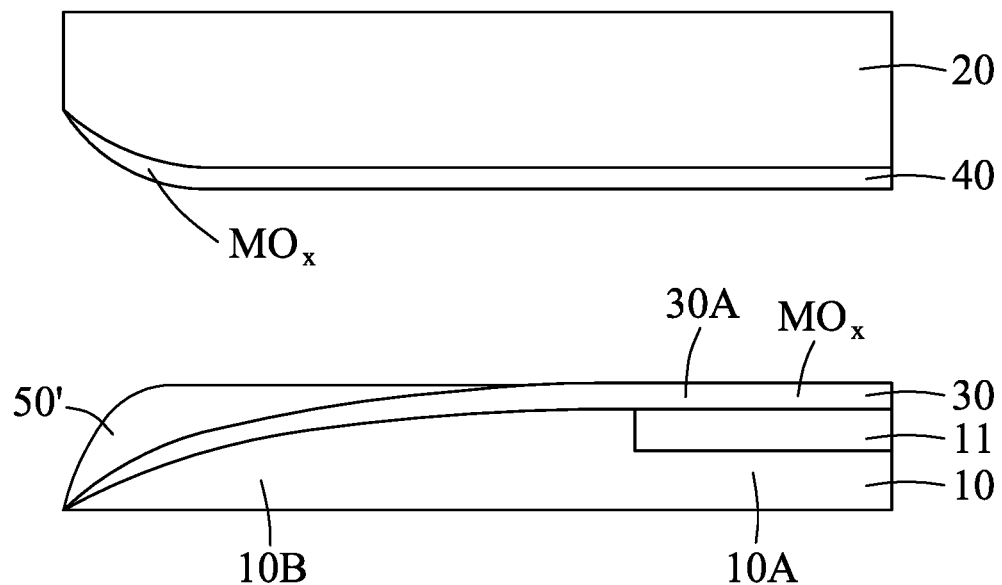

Referring to FIG. 1 and the example illustrated in FIG. 4, the method 100 proceeds to step 103, where a planarization process is conducted on the rebuilding layer to remove a portion of the rebuilding layer. FIG. 4 is a schematic view which illustrates conducting of a planarization process on the rebuilding layer 50 to remove a portion of the rebuilding layer 50, so that a remaining portion of the rebuilding layer 50 has a planarized surface which is substantially flush with the upper surface of the main portion 30A of the first bonding layer 30. Hereinafter, the remaining portion of the rebuilding layer is denoted by the numeral 50'. The planarized surface of the rebuilding layer 50' is formed to be substantially flush with the upper surface of the main portion 30A of the first bonding layer 30 so as to make the rebuilding layer 50' cooperate with the first bonding layer 30 to provide a large contact surface for the device substrate 10 to be bonded to the carrier substrate 20 described subsequently in step 105. In some embodiments, after the planarization process, the upper surface of the main portion 30A of the first bonding layer 30 has a topological specification ranging from about 0 angstrom (Å) to about 300 Å, and a roughness specification ranging from about 0 Å to about 5 Å.

In some embodiments, the planarization process is a CMP process. Other suitable processes for forming the planarized surface of the rebuilding layer 50' are within the contemplated scope of the present disclosure. The CMP process is conducted over the rebuilding layer 50, and stops at the main portion 30A of the first bonding layer 30, which has a polishing rate different from that of the rebuilding layer 50 and which may serve as a polishing stop layer.

Figure 5:
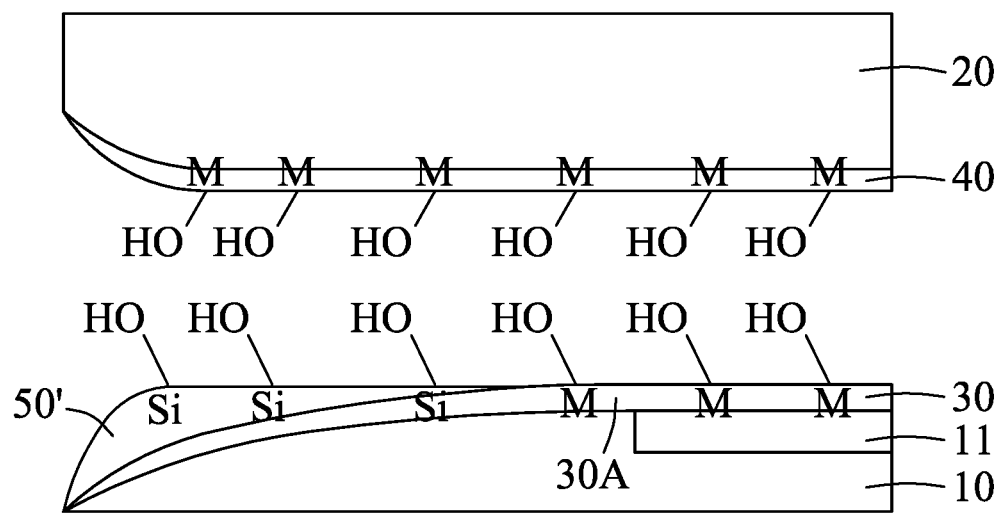

Referring to FIG. 1 and the example illustrated in FIG. 5, the method 100 proceeds to step 104, where a surface modification process is conducted. FIG. 5 is a schematic view which illustrates conducting a surface modification process on the second bonding layer 40, the rebuilding layer 50', and the main portion 30A of the first bonding layer 30, so as to form M-OH bonds on the surface of the second bonding layer 40 and the surface of the main portion 30A of the first bonding layer 30 facing toward each other and to form Si—OH bonds on the surface of the rebuilding layer 50' facing toward the surface of the second bonding layer 40. In some embodiments, the surface modification process may be conducted by a plasma treatment process. In some embodiments, the plasma treatment process is conducted at a temperature ranging from about room temperature to about 300° C. so as to maintain the first bonding layer 30 and the second boning layer 40 in the amorphous state after the plasma treatment process. If the plasma treatment process is conducted at a temperature higher than 300° C., the first bonding layer and the second bonding layer 40 may be undesirably converted to the crystalline state after the plasma treatment process. In some embodiments, a gas source for conducting the plasma treatment process may include, for example, but not limited to, a gas mixture of oxygen ($O_2$) and hydrogen ($H_2$), a gas mixture of carbon dioxide ($CO_2$) and hydrogen ($H_2$), a gas mixture of nitrous oxide ($N_2O$) and hydrogen ($H_2$), or the like. Other suitable gases are within the contemplated scope of the present disclosure. In some embodiments, a rinsing process may be conducted on the second bonding layer 40, the rebuilding layer and the main portion 30A of the first bonding layer 30 after the plasma treatment process, so as to increase the amount of the M-OH bonds formed on the surfaces of the second bonding layer 40 and the main portion 30A of the first bonding layer 30 and the amount of Si—OH bonds formed on the surface of the rebuilding layer 50'. In some embodiments, the rinsing process may be performed with water. In some embodiments, the surface modification process may be conducted by a wet chemical process. In some embodiments, the wet chemical process may be conducted using an aqueous solution of a high temperature sulfuric peroxide mixture (HTSPM), a low temperature sulfuric peroxide mixture (LTSPM), hydrogen peroxide ($H_2O_2$), or the like. Other suitable aqueous chemical solutions are within the contemplated scope of the present disclosure.

Figure 6:
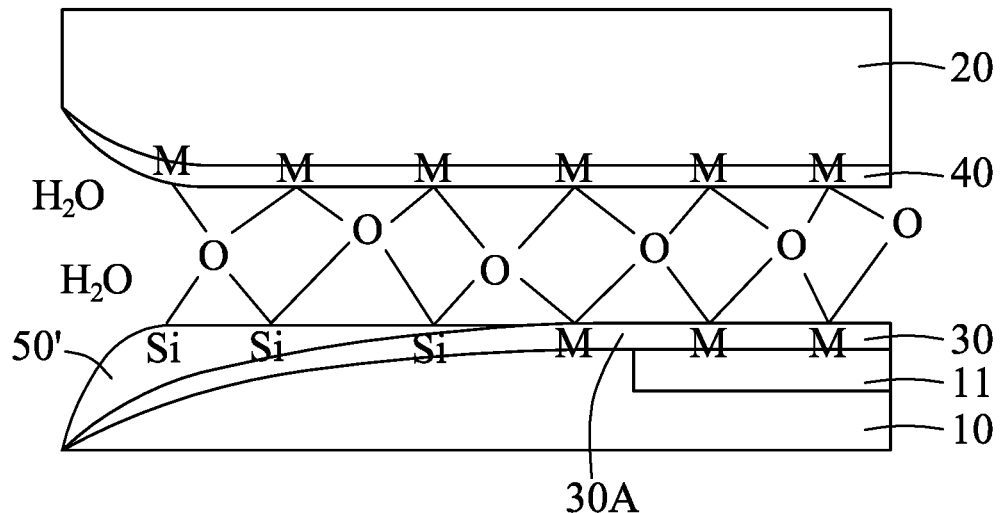
Figure 7:
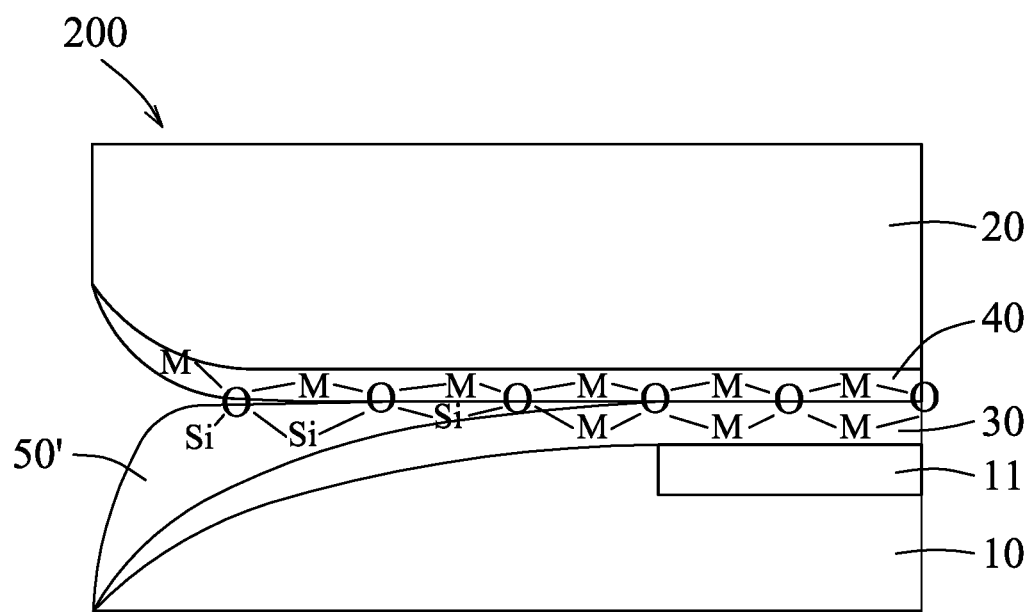

Referring to FIG. 1 and the example illustrated in FIG. 6, the method 100 proceeds to step 105, where the device substrate and the carrier substrate are bonded to each other. FIG. 6 is a schematic view which illustrates bonding of the device substrate to the carrier substrate 20. The device substrate 10 and the carrier substrate 20 are mounted on an upper chuck and a lower chuck of a bonding apparatus (not shown), respectively, or vice versa. In some embodiments, the bonding apparatus is operated at about room temperature. In some embodiments, the upper chuck is operated at a chuck vacuum ranging from about 0 millibar (mbar) to about 90 mbar to permit one of the device substrate 10 and the carrier substrate 20 to be mounted thereon, and the lower chuck is operated at a chuck vacuum ranging from about 200 mbar to about 900 mbar to permit the other one of the device substrate 10 and the carrier substrate 20 to be mounted thereon. The device substrate 10 and the carrier substrate 20 are then aligned with each other and are brought toward each other, and a bonding force is applied onto a center of an upper surface of the carrier substrate 20 opposite to the device substrate 10 (or a center of an upper surface of the device substrate 10 opposite to the carrier substrate 20) using a pin of the bonding apparatus to allow the second bonding layer 40 to be in contact with the rebuilding layer 50' and the main portion 30A of the first bonding layer 30. In some embodiments, the bonding force ranges from about 0.7 N to about 1.2 N. As the second bonding layer 40 is brought in contact with the rebuilding layer 50' and the main portion of the first bonding layer 30, the Si—OH bonds and the M-OH bonds polymerize to result in formation of Si—O-M and M-O-M bonds and water molecules ($H_2O$). As the bonding force is applied continuously, the water molecules diffuse away from an interface between the second bonding layer 40 and the rebuilding layer 50' and the main portion of the first bonding layer 30, and the second bonding layer 40 starts to adhere with the rebuilding layer 50' and the main portion 30A of the first bonding layer 30 through the Si—O-M and M-O-M bonds.

Referring to FIG. 1 and the example illustrated in FIG. 7, the method 100 proceeds to step 106, where the first bonding layer and the second bonding layer are annealed. FIG. 7 is a schematic view which illustrates annealing of the first bonding layer and the second bonding layer 40 by an annealing process. The first bonding layer 30 and the second bonding layer 40 are annealed to convert the first bonding layer 30 and the second bonding layer 40 from the amorphous state to the crystalline state and to remove the water molecules. In some embodiments, the first bonding layer 30 and the second bonding layer 40 are annealed at a temperature ranging from about 260° C. to about 600° C. If the first bonding layer 30 and the second bonding layer 40 are annealed at a temperature lower than 260° C., the first bonding layer 30 and the second bonding layer cannot be converted from the amorphous state to the crystalline state. If the first bonding layer 30 and the second bonding layer 40 are annealed at a temperature higher than 600° C., the semiconductor structure 200 thus formed may be damaged. In some embodiments, the first bonding layer 30 and the second bonding layer 40 are annealed at a temperature ranging from about 300° C. to about 400° C. In some embodiments, the first bonding layer 30 and the second bonding layer 40 are annealed at a temperature ranging from about 325° C. to about 400° C. In some embodiments, the first bonding layer 30 and the second bonding layer 40 are annealed for a time period ranging from about 30 seconds to about 300 minutes. If the first bonding layer 30 and the second bonding layer 40 are annealed for a time period less than 30 seconds, the first bonding layer 30 and the second bonding layer 40 cannot be converted from the amorphous state to the crystalline state. A gap which may be formed between the second bonding layer 40 and the rebuilding layer 50' and the main portion 30A of the first bonding layer 30 is reduced after the annealing process.

When the semiconductor structure 200 thus formed is analyzed by transmission electron microscopy (TEM), the TEM images of the semiconductor structure 200 show that in some embodiments, when the first bonding layer 30 and the second bonding layer 40 are annealed at a temperature lower than 260° C., the first bonding layer 30 and the second bonding layer 40 are maintained in the amorphous state. When the first bonding layer 30 and the second bonding layer 40 are annealed at a temperature of about 260° C., the first bonding layer 30 and the second bonding layer 40 would begin to be converted from the amorphous state to the crystalline state. When the first bonding layer 30 and the second bonding layer 40 are annealed continuously at a temperature ranging from about 260° C. to about 600° C. for a time period ranging from about 30 seconds to about 300 minutes, the first bonding layer 30 and the second bonding layer 40 are converted from the amorphous state to the crystalline state.

Figure 8:
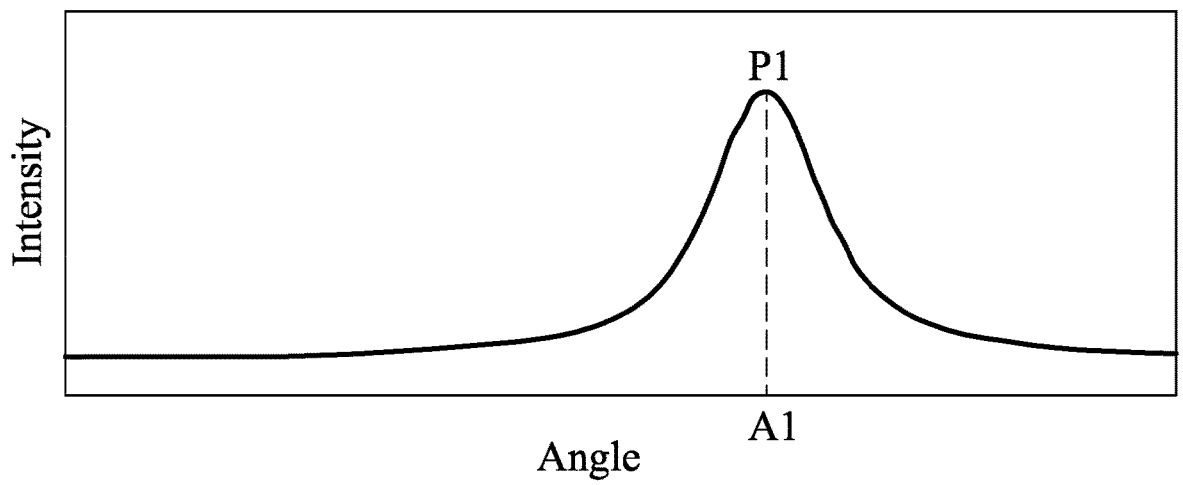
FIG. 8 illustrates a graph showing an X-ray diffraction (XRD) result of a metal oxide bonding layer formed using a deposition process at a deposition temperature.

FIG. 8 illustrates a graph showing an X-ray diffraction (XRD) result of the first bonding layer 30 formed on the device substrate 10 (or the second bonding layer 40 formed on the carrier substrate 20) using a deposition process at a deposition temperature of at least room temperature and less than about 260° C. As shown in FIG. 8, in some embodiments, a characteristic peak P1 at an angle A1 observed in the graph represents that the first bonding layer 30 formed on the device substrate 10 (or the second bonding layer 40 formed on the carrier substrate 20) by the deposition process at the aforesaid deposition temperature is at the amorphous state.

Figure 9:
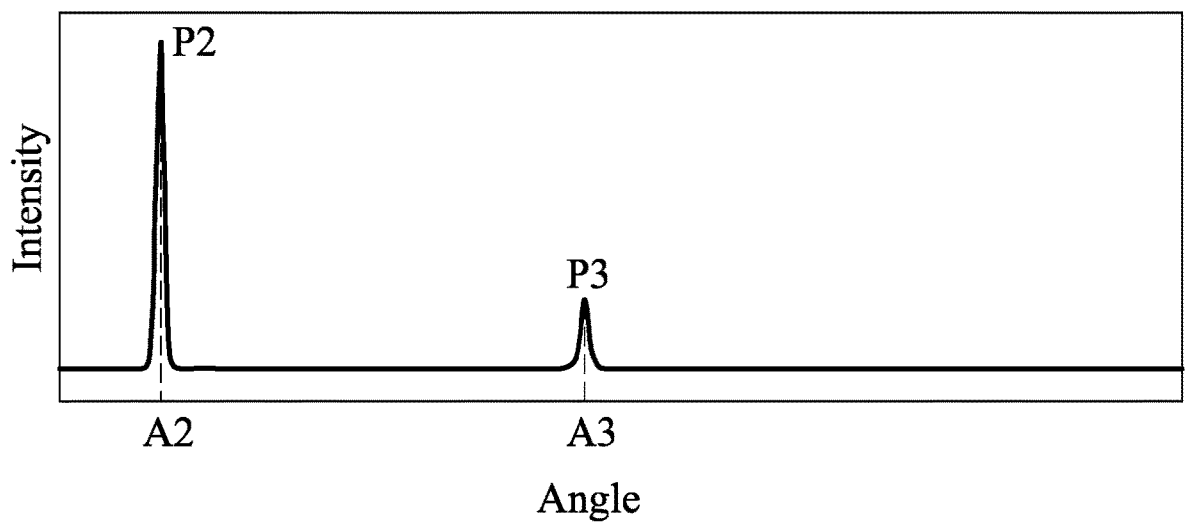
FIG. 9 illustrates a graph showing an XRD result of the metal oxide bonding layer after an annealing process conducted at an annealing temperature.

FIG. 9 illustrates a graph showing an XRD result of the first bonding layer 30 (or the second bonding layer 40) after the annealing process conducted at a temperature ranging from about 260° C. to about 600° C. for a time period ranging from about 30 seconds to about 300 minutes. As shown in FIG. 9, in some embodiments, a characteristic peak P2 at an angle A2 and a characteristic peak P3 at an angle A3 observed in the graph represent the first bonding layer 30 or the second bonding layer 40 formed after the annealing process is converted from the amorphous state to the crystalline state.

In the semiconductor structure 200 illustrated in FIG. 7, the device substrate 10 and the carrier substrate 20 are bonded to each other through the first and second bonding layers 30, 40 in the crystalline state and the rebuilding layer 50', and a bonding strength produced therebetween ranges from about 1.2 $J/m^2$ to about 2.4 $J/m^2$. In addition, compared to a semiconductor structure in which a device substrate and a carrier substrate are bonded to each other through a silicon oxide bonding layer having a thermal conductivity of about 1 W/(m·k), the first and second bonding layers 30, 40 in the crystalline state formed between the device substrate 10 and the carrier substrate 20 has a thermal conductivity ranging from about 4 W/(m·k) to about 22 W/(m·k), which is significantly higher than that of the silicon oxide bonding layer. Therefore, the first and second bonding layers 30, 40 in the crystalline state can provide a significant superior heat dissipation effect for the semiconductor structure 200. In addition, the first and second bonding layers 30, 40 in the crystalline state formed between the device substrate and the carrier substrate 20 can withstand a dry clean process and/or a wet clean process which may be conducted in subsequent processing methods.

The semiconductor device 200 may be further processed so as to be utilized in different applications. For instance, in some embodiments, the semiconductor structure 200 is flipped over, and the device substrate 10 may be subjected to a planarization process, e.g., a CMP process, so as to expose the semiconductor device 11 for further processing. In some other embodiments, an optional step of removing an excess portion of the rebuilding layer 50' and/or the first bonding layer 30 located at a bottom side of the device substrate 10 opposite to the semiconductor device 11 may be performed.

In a method for manufacturing a semiconductor structure of the present disclosure, a first bonding layer and a second bonding layer are formed on a device substrate and a carrier substrate, respectively. The first bonding layer includes a first metal oxide material, and the second bonding layer includes a second metal oxide material which may be the same as or similar to the first metal oxide material. The device substrate and the carrier substrate are bonded to each other through the first and second bonding layers. The first and second metal oxide materials of the first and second bonding layers are converted from an amorphous state to a crystalline state after an annealing process, and the first and second metal oxide materials in the crystalline state have a high thermal conductivity, such that the first and second bonding layers including the metal oxide materials in the crystalline state can prove a superior heat dissipation effect for the semiconductor structure. In addition, the first and second bonding layers in the crystalline state formed between the device substrate and the carrier substrate can withstand a dry clean process and/or a wet clean process which may be conducted in subsequent processing methods.

In accordance with some embodiments of the present disclosure, a method for manufacturing a semiconductor structure includes: forming a first bonding layer on a device substrate formed with a semiconductor device so as to cover the semiconductor device, the first bonding layer including a first metal oxide material in an amorphous state; forming a second bonding layer on a carrier substrate, the second bonding layer including a second metal oxide material in an amorphous state; conducting a surface modification process on the first bonding layer and the second bonding layer; bonding the device substrate and the carrier substrate to each other through the first and second bonding layers; and annealing the first and second bonding layers so as to convert the first and second metal oxide materials from the amorphous state to a crystalline state.

In accordance with some embodiments of the present disclosure, the first bonding layer and the second bonding layer are formed on the device substrate and the carrier substrate independently by a deposition process conducted at a temperature ranging from room temperature to 300° C.

In accordance with some embodiments of the present disclosure, the first and second metal oxide materials each independently have a general formula of MOx, wherein M is selected from Al, Ti, Ni, Zn, or combinations thereof, and x is a number satisfying the valence of M. M-OH bonds are formed on a surface of the first bonding layer and a surface of the second bonding layer facing toward each other after the surface modification process. The M-OH bonds polymerize to result in formation of M-O-M bonds and water molecules. The first and second bonding layers are bonded to each other through the M-O-M bonds.

In accordance with some embodiments of the present disclosure, the surface modification process is conducted by a plasma treatment process.

In accordance with some embodiments of the present disclosure, the plasma treatment process is conducted at a temperature ranging from room temperature to 300° C.

In accordance with some embodiments of the present disclosure, the plasma treatment process is conducted using a gas source which includes a gas mixture of oxygen and hydrogen, a gas mixture of carbon dioxide and hydrogen, a gas mixture of nitrous oxide and hydrogen, or combinations thereof.

In accordance with some embodiments of the present disclosure, the surface modification process is conducted by a wet chemical process.

In accordance with some embodiments of the present disclosure, the wet chemical process is conducted using an aqueous solution of a high temperature sulfuric peroxide mixture, a low temperature sulfuric peroxide mixture, hydrogen peroxide, or combinations thereof.

In accordance with some embodiments of the present disclosure, the first and second bonding layers are annealed at a temperature ranging from 260° C. to 600° C.

In accordance with some embodiments of the present disclosure, a method for manufacturing a semiconductor structure includes: forming a first bonding layer on a device substrate formed with a semiconductor device so as to cover the semiconductor device, the first bonding layer including a first metal oxide material in an amorphous state and having a main portion and a peripheral portion surrounding the main portion; forming a second bonding layer on a carrier substrate, the second bonding layer including a second metal oxide material in an amorphous state; forming a rebuilding layer on the peripheral portion of the first bonding layer; conducting a surface modification process on the first bonding layer, the second bonding layer, and the rebuilding layer; bonding the device substrate and the carrier substrate to each other through the first and second bonding layers and the rebuilding layer; and annealing the first and second bonding layers so as to convert the first and second metal oxide materials from the amorphous state to a crystalline state.

In accordance with some embodiments of the present disclosure, the first bonding layer and the second bonding layer are formed on the device substrate and the carrier substrate independently by a deposition process conducted at a temperature ranging from room temperature to 300° C.

In accordance with some embodiments of the present disclosure, the first and second metal oxide materials each independently have a general formula of MOx, wherein M is selected from Al, Ti, Ni, Zn, or combinations thereof, and x is a number satisfying the valence of M. The rebuilding layer includes silicon oxide, silicon oxynitride, or a combination thereof. M-OH bonds are formed on a surface of the first bonding layer and a surface of the second bonding layer facing toward each other, and Si—OH bonds are formed on a surface of the rebuilding layer facing toward the surface of the second bonding layer after the surface modification process. The M-OH bonds and the Si—OH bonds polymerize to result in formation of M-O-M bonds, Si—O-M bonds, and water molecules. The first and second bonding layers are bonded to each other through the M-O-M bonds and Si—O-M bonds.

In accordance with some embodiments of the present disclosure, the surface modification process is conducted by a plasma treatment process at a temperature ranging from room temperature to 300° C.

In accordance with some embodiments of the present disclosure, the plasma treatment process is conducted using a gas source which includes a gas mixture of oxygen and hydrogen, a gas mixture of carbon dioxide and hydrogen, a gas mixture of nitrous oxide and hydrogen, or combinations thereof.

In accordance with some embodiments of the present disclosure, the surface modification process is conducted by a wet chemical process.

In accordance with some embodiments of the present disclosure, the wet chemical process is conducted using an aqueous solution of a high temperature sulfuric peroxide mixture, a low temperature sulfuric peroxide mixture, hydrogen peroxide, or combinations thereof.

In accordance with some embodiments of the present disclosure, the first and second bonding layers are annealed at a temperature ranging from 260° C. to 600° C.

In accordance with some embodiments of the present disclosure, a semiconductor structure includes a device substrate, a semiconductor device disposed on the device substrate, a first bonding layer disposed on the device substrate to cover the semiconductor device and including a first metal oxide material in a crystalline state, a carrier substrate, and a second bonding layer disposed on the carrier substrate and including a second metal oxide material in a crystalline state. The device substrate and the carrier substrate are bonded to each other through the first and second bonding layers.

In accordance with some embodiments of the present disclosure, the first bonding layer includes a main portion covering the semiconductor device and bonded to the second bonding layer, and a peripheral portion surrounding the main portion. The semiconductor structure further comprises a rebuilding layer disposed on the peripheral portion of the first bonding layer and bonded to the second bonding layer. The rebuilding layer includes silicon oxide, silicon oxynitride, or a combination thereof.

In accordance with some embodiments of the present disclosure, the first metal oxide material and the second metal oxide material each independently has a general formula of MOx, wherein M is selected from Al, Ti, Ni, Zn, or combinations thereof, and x is a number satisfying the valence of M.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a first bonding layer on a device substrate formed with a semiconductor device so as to cover the semiconductor device, the first bonding layer including a first metal oxide material in an amorphous state;
    forming a second bonding layer on a carrier substrate, the second bonding layer including a second metal oxide material in an amorphous state;
    conducting a surface modification process on the first bonding layer and the second bonding layer;
    bonding the device substrate and the carrier substrate to each other through the first bonding layer and the second bonding layer; and
    annealing the first bonding layer and the second bonding layer so as to convert the first metal oxide material and the second metal oxide material from the amorphous state to a crystalline state,
    wherein at least one of the first metal oxide material and the second metal oxide material has a formula of MOx, wherein M is selected from Ni, Zn, or a combination thereof, and x is a number satisfying the valence of M.

2. The method according to claim 1, wherein the first bonding layer and the second bonding layer are formed on the device substrate and the carrier substrate independently by a deposition process conducted at a temperature ranging from room temperature to 200° C.

3. The method according to claim 1, wherein
    M-OH bonds are formed on a surface of the first bonding layer and a surface of the second bonding layer facing toward each other after the surface modification process;
    the M-OH bonds polymerize to result in formation of M-O-M bonds and water molecules, the first bonding layer and the second bonding layer being bonded to each other through the M-O-M bonds; and
    the surface modification process is performed after formation of the first bonding layer and the second bonding layer.

4. The method according to claim 1, wherein the surface modification process is conducted by a plasma treatment process.

5. The method according to claim 4, wherein the plasma treatment process is conducted at a temperature ranging from room temperature to 300° C.

6. The method according to claim 4, wherein the plasma treatment process is conducted using a gas source which includes a gas mixture of oxygen and hydrogen, a gas mixture of carbon dioxide and hydrogen, a gas mixture of nitrous oxide and hydrogen, or combinations thereof.

7. The method according to claim 1, wherein the surface modification process is conducted by a wet chemical process.

8. The method according to claim 7, wherein the wet chemical process is conducted using an aqueous solution of a high temperature sulfuric peroxide mixture, a low temperature sulfuric peroxide mixture, hydrogen peroxide, or combinations thereof.

9. The method according to claim 1, wherein the first bonding layer and the second bonding layer are annealed at a temperature ranging from 300° C. to 600° C.

10. A method for manufacturing a semiconductor structure, comprising:
forming a first bonding layer on a device substrate formed with a semiconductor device so as to cover the semiconductor device, the first bonding layer including a first metal oxide material in an amorphous state and having a main portion and a peripheral portion surrounding the main portion;
forming a second bonding layer on a carrier substrate, the second bonding layer including a second metal oxide material in an amorphous state;
forming a rebuilding layer on the peripheral portion of the first bonding layer;
conducting a surface modification process on the first bonding layer, the second bonding layer, and the rebuilding layer;
bonding the device substrate and the carrier substrate to each other through the first bonding layer, the second bonding layer, and the rebuilding layer; and
annealing the first bonding layer and the second bonding layer so as to convert the first metal oxide material and the second metal oxide material from the amorphous state to a crystalline state,
wherein formation of the rebuilding layer on the peripheral portion of the first bonding layer includes:
disposing a first blocking element above the main portion of the first bonding layer opposite to the device substrate, and
performing a deposition process so as to form the rebuilding layer selectively on the peripheral portion of the first bonding layer.

11. The method according to claim 10, wherein the first bonding layer and the second bonding layer are formed on the device substrate and the carrier substrate independently by a deposition process conducted at a temperature ranging from room temperature to 300° C.

12. The method according to claim 10, wherein
the first metal oxide material and the second metal oxide material each independently have a general formula of MOx, wherein M is selected from Al, Ti, Ni, Zn, or combinations thereof, and x is a number satisfying the valence of M;
the rebuilding layer includes silicon oxide, silicon oxynitride, or a combination thereof;
M-OH bonds are formed on a surface of the first bonding layer and a surface of the second bonding layer facing toward each other, and Si—OH bonds are formed on a surface of the rebuilding layer facing toward the surface of the second bonding layer after the surface modification process; and
the M-OH bonds and the Si—OH bonds polymerize to result in formation of M-O-M bonds, Si—O-M bonds, and water molecules, the first bonding layer and the second bonding layer being bonded to each other through the M-O-M bonds and Si—O-M bonds.

13. The method according to claim 10, wherein the surface modification process is conducted by a wet chemical process.

14. The method according to claim 13, wherein the wet chemical process is conducted using an aqueous solution of a high temperature sulfuric peroxide mixture, a low temperature sulfuric peroxide mixture, hydrogen peroxide, or combinations thereof.

15. The method according to claim 10, wherein the first bonding layer and the second bonding layer are annealed at a temperature ranging from 260° C. to 600° C.

16. The method according to claim 10, wherein formation of the rebuilding layer on the peripheral portion of the first bonding layer further includes, prior to performing the deposition process, disposing a second blocking element above the device substrate opposite to the first bonding layer, such that the device substrate and the first bonding layer are interposed between the first blocking element and the second blocking element.

17. A method for manufacturing a semiconductor structure, comprising:
forming a first bonding layer on a device substrate formed with a semiconductor device so as to cover the semiconductor device, the first bonding layer including a first metal oxide material in an amorphous state and having a main portion and a peripheral portion surrounding the main portion;
forming a second bonding layer on a carrier substrate, the second bonding layer including a second metal oxide material in an amorphous state and having a main portion and a peripheral portion surrounding the main portion of the second bonding layer;
forming a rebuilding layer on the peripheral portion of the first bonding layer;
conducting a planarization process on the rebuilding layer;
conducting a surface modification process on the first bonding layer, the second bonding layer, and the rebuilding layer;
bonding the device substrate and the carrier substrate to each other through the first bonding layer, the second bonding layer, and the rebuilding layer, wherein the main portion of the first bonding layer is bonded to the main portion of the second bonding layer, and the rebuilding layer is bonded to the peripheral portion of the second bonding layer; and
annealing the first bonding layer and the second bonding layer so as to convert the first metal oxide material and the second metal oxide material from the amorphous state to a crystalline state,
wherein formation of the rebuilding layer on the peripheral portion of the first bonding layer includes:
disposing a first blocking element above the main portion of the first bonding layer opposite to the device substrate, and
performing a deposition process so as to form the rebuilding layer selectively on the peripheral portion of the first bonding layer.

18. The method according to claim 17, wherein after the planarization process, the rebuilding layer is formed with a planarized surface which is flush with an upper surface of the main portion of the first bonding layer.

19. The method according to claim 17, wherein
the surface modification process is conducted by a plasma treatment process at a temperature ranging from room temperature to 300° C.; and
the method further comprises, after the plasma treatment process, conducting a rinsing process on the second bonding layer, the rebuilding layer, and the main portion of the first bonding layer.

20. The method according to claim 17, wherein the rebuilding layer is formed by a plasma-enhanced chemical vapor deposition process using oxygen and a precursor which includes silane, tetraethoxysilane, or a combination thereof.

* * * * *